United States Patent [19]
Takano

[11] Patent Number: 6,002,924
[45] Date of Patent: Dec. 14, 1999

[54] FULL-SPECTRUM ALL-MODE RADIO RECEIVER APPARATUS AND METHOD

[75] Inventor: Shigeru Takano, Tokyo, Japan

[73] Assignee: AOR, Ltd., Tokyo, Japan

[21] Appl. No.: 08/778,381

[22] Filed: Dec. 31, 1996

[51] Int. Cl.⁶ ..................................................... H04B 1/18
[52] U.S. Cl. ...................... 455/161.1; 455/316; 455/260
[58] Field of Search ................... 455/295, 296, 455/302, 303, 307, 310–312, 313–320, 323, 255–260, 264–265, 161.1; 329/307, 318, 320, 325, 316, 348, 360; 331/31, 46

[56] References Cited

U.S. PATENT DOCUMENTS

| | | |
|---|---|---|
| 3,937,972 | 2/1976 | Snell . |
| 3,961,261 | 6/1976 | Pflasterer . |
| 3,987,400 | 10/1976 | Fathauer . |
| 4,000,468 | 12/1976 | Brown et al. . |
| 4,027,251 | 5/1977 | Fathauer et al. . |
| 4,114,103 | 9/1978 | Pflasterer . |
| 4,123,715 | 10/1978 | Fathauer . |
| 4,270,217 | 5/1981 | Baker . |
| 4,409,688 | 10/1983 | Baker . |
| 4,627,100 | 12/1986 | Takano . |
| 5,210,484 | 5/1993 | Remillard et al. ...................... 455/314 |
| 5,606,736 | 2/1997 | Hasler et al. ............................. 455/314 |
| 5,752,174 | 5/1998 | Matai et al. .............................. 455/316 |

FOREIGN PATENT DOCUMENTS

| | | | |
|---|---|---|---|
| 59-128833 | 7/1984 | Japan | ...................................... 455/314 |
| 60-1926 | 1/1985 | Japan | ...................................... 455/314 |
| 60-203026 | 10/1985 | Japan | ...................................... 455/314 |
| 710051 | 2/1995 | Japan . | |

OTHER PUBLICATIONS

English Translation of Japanese Reference 59–128833.

*Primary Examiner*—Reinhard J. Eisenzopf
*Assistant Examiner*—Sam Bhattacharya
*Attorney, Agent, or Firm*—Oppenheimer Wolff and Donnelly LLP

[57] ABSTRACT

A full-spectrum, multi-mode radio receiver provides truly continuous coverage of reception of radio signals in a variety of modes or formats, and in a frequency range extending from about 10 kHz to about 2600 MHz. That is, there or no frequencies or frequency bands within which reception is not possible or is possible only with a reduced performance of the radio receiver, because of spurs, intermodulation products, or images. The radio receiver provides this broad-spectrum, continuous coverage of reception, and does so with a receiver front-end tuning selectivity to as little as 1 Hz.

4 Claims, 3 Drawing Sheets

FULL-SPECTRUM ALL-MODE RADIO RECEIVER APPARATUS AND METHOD

BACKGROUND OF THE INVENTION

1. Field of the Invention

The present invention is in the field of radio receivers. More particularly, the present invention relates to a radio receiver, which may desirably take the form of a scanner-type of receiver, having wide-band, full-spectrum receiving capability (nominal receiving frequency from about 10 kHz to about 2600 MHz—with receiving frequency steps as small as 1 Hz). Still more particularly, the present invention relates to a triple-hetrodyne radio receiver which according to the present invention may receive radio signals in a variety of formats or modes, such as in amplitude modulation (AM), Narrow-band frequency modulation (NBFM), wide-band FM (WBFM), single side band (SSB) in both of the upper and lower side bands (i.e., USB and LSB), carrier wave (CW, sometimes referred to as Morris Code format), Citizen's Band (CB), VHF, UHF (i.e., television and other broadcast portions of WBFM), police, commercial, aviation, marine, and other frequency bands, as well as in other formats or modes, including digital formats (dependent upon output-stage demodulating and decoding facilities which may be provided along with the front-end radio receiver).

2. Related Technology

Conventional radio receivers, generally termed "broad-band" or "wide-band" radio receivers are known. Some of these radio receivers take the form of "scanner" type receivers in which the receiver continuously "scans" preselected frequencies one at a time seeking signals to receive. When a scanner detects a signal in one of the selected frequencies, it stops scanning for a while and receives the detected signal. Other conventional radio receivers require the operator to tune the receiver to a frequency to be received.

Some of these radio receivers have a first stage or "front end" radio frequency demodulation stage which includes a number of parallel narrow-band receivers, each configured to cover a comparatively narrow band of the radio frequency spectrum. The RF band coverage provided by these narrow-band receivers is of adjacent frequency bands so that substantially full coverage of the RF spectrum is provided by the plural receivers in combination. In order to cover the RF spectrum, the narrow-band receivers are switched on and off, and in and out of the circuits of the receiver as the user tunes the radio up and down the RF spectrum. In this configuration of radio, each parallel narrow-band front end section will have its own first IF stage, first LO, second IF, and second LO. Additionally, the radio includes the necessary switching apparatus and circuits to enable the narrow-band front end sections one at a time while the others are disabled according to the portion of the RF spectrum being tuned at a particular time. As a result of this multiplicity of parallel front end stages, controls and switching apparatus, the radios of this type are expensive and complex.

An alternative configuration of broad band radio receiver attempts to choose the first IF and first LO, the second IF and second LO, so that internally-generated frequency interferences are outside of the frequencies of interest, so much as is possible. However, this approach results in frequency exclusions, as is further explained. That is, it is known that because of spurs (i.e., spurious responses), inter-modulation distortion, and image frequency responses, certain frequencies of the electromagnetic spectrum are conventionally unavailable for reception by conventional broad-band or wide-band radio receivers of this type.

To recap the conventional understanding of the limitations of wide or broad band radio receivers of this type, it will be recalled that in hetrodyne demodulation of radio-frequency (RF) signals, two signals [the RF signal and a local oscillator (LO) signal] are combined in multiplication. Multiplication of two sine wave signals together provides one cosine signal which is the sum of the two frequencies, and another cosine signal which is the difference of the two frequencies. Usually, the difference signal is of interest for further demodulation processing, and is referred to as an intermediate frequency (IF) signal.

To create the sum and difference signals true multipliers are not normally used. Instead, fast-switching diodes driven by a square-wave LO signal and a balun transformer can be used to achieve the desired multiplication effect. A variety of alternatives are known to the use of fast-switching diodes. For example, balanced mixers, double balanced mixers, double-double balanced mixers, and Gilbert cells (these a true multiplier) are known. Each of these conventional RF demodulation expedients has its advantages and limitations, as are conventionally known. For example, the Gilbert cell does not usually work at high RF frequencies, as will be further considered below.

A spur (spurious response) is created by mixing harmonics of an RF signal and a harmonic of the LO frequency to generate the IF frequency.

An inter-modulation product results from the mixing of two RF signals and their harmonics to produce the IF frequency. Inter-modulation distortion is a type of interference that results from the mixing of integer multiples of signal frequencies in a nonlinear stage or device. The resulting mixing of signal products can interfere with desired signals on the mixed frequencies.

An image occurs when an IF frequency is less than half of the tunable band of a receiver, and the receiver is tuned to an RF signal near the bottom of the tuning range (with a high-side LO). The receiver will detect a signal at a second frequency which equals the desired frequency plus 2 times the IF frequency.

In order to attempt to avoid the limitations imposed by these spurs, inter-modulation products, and images, some conventional radios of the broad or wide band type use "pre-selectors". A pre-selector is a circuit which provides an amplification of a desired frequency signal with attenuation of other frequencies. Usually, a pre-selector is voltage-tunable, and passes a desired frequency with normal gain, while attenuating offending frequencies.

However, the conventional solutions to the problems of receiving the full radio-frequency electromagnetic spectrum are imperfect. As a result, conventional radio receivers of this type are accompanied by frequency range charts informing their users of frequencies or ranges of frequencies at which reception is not possible with acceptable performance of the receiver. As an example, a commercially available example of a conventional broad-band or wide-band radio receiver (which asserts to cover the 500 kHz to 1300 MHz frequency range), includes a chart informing the user that the following frequencies are unavailable for reception:

253–256 MHz, 262–267 MHz, 271–276 MHz, 380–383 MHz, 412–416 MHZ, 531–540 MHz, 556–572 MHz, 624–635 MHz, 810–835 MHz, 860–890 MHz, 915–961 MHz, and 995–1016 MHz As can be seen, although this conventional radio receiver product is termed "continuous coverage", it does not in fact provide continuous reception of the radio frequency electromagnetic spectrum within its operating range.

Another conventional wide-band radio receiver is known in accord with U.S. Pat. No. 4,627,100, issued Dec. 2, 1986, to Shigeru Takano, and assigned to Regency Electronics of Indianapolis, Indiana (hereinafter, "the Takano '100" patent). This wide band radio scanner type of receiver is believed to provide reception from about 25 MHz to about 550 MHz continuously, and to employ upper conversion (i.e., the first LO frequency is higher than the receiving frequency—in the range from 775 MHz to 1300 MHz) so that image response frequencies are outside of the frequency band of interest, so much as is possible. The Takano '100 patent is believed to employ a variable first IF section with a first mixer receiving a first LO frequency from either one or two phase locked loop (PLL) oscillators. A second IF section uses a crystal oscillator to originate the second LO frequency, and includes several multipliers each of different multiplication factor. The multiplier selected provides a second LO frequency (which is a multiple of the crystal oscillator frequency), and which is then mixed at the second IF stage mixer.

In other words, the Takano '100 patent is believed to expand the frequency coverage of the receiver by providing a method of generating a high-frequency stable first LO frequency. However, this approach still results in some frequency exclusions due to the spurs (i.e., internally generated spurious signals).

The following is a list of the frequencies which will not be received or scanned by a commercially available radio receiver according to the Takano '100 patent due to the internally generated interference signals (i.e., the spurs):

1.59 MHz, 3.18 MHz, 12.58 MHz, 16.78 MHz, 20.97 MHz, 76.8 MHz, 89.6 MHz, 96.0 MHz, 102.4 MHz, 108.8 MHz, 115.2 MHz, 123.58 MHz, 140.34 MHz, 153.6 MHz, 170.36 MHz, 200.38 MHz, 230.4 MHz, 370.74 MHz, 400.78 MHz, 430.78 MHz, and 460.8 MHz Another conventional radio receiver is known from Japanese patent No. H7-10051, issued Feb. 1, 1995, to Yaesu Musen K.K., by inventor Yoshiaki Hashimoto (hereinafter, the "Yaesu" patent). The Yaesu patent is believed to teach a short wave, single-side-band type of receiver, in which a multiple-conversion super-hetrodyne type of front end receiver section is used. The front end receiver section has a first LO selectively controlled by a CPU to convert the received signal to a first intermediate frequency (i.e., to a first IF). A second LO and second IF are used also, with the second LO signal source being switchable between two oscillators. The CPU controls the second LO signal source to switch the necessary second local oscillator output frequency to the associated mixer so that a spur possibly generated in the mixer falls into a band-pass of the second IF filter. A single side band detector, also controlled by the CPU, is switched between USB and LSB oscillators to provide a detection function.

However, dependent upon whether an upper or lower side band is being used, the CPU of the Yaesu patent controls the first LO to a constant frequency. That is, a first LO frequency may be used for lower side band operation, and a different LO frequency will be used for upper side band operation. But, so long as the Yaesu receiver is operated in upper or lower side band mode, the frequency of the first LO is not changed, it is believed. Additionally, because the Yaesu receiver is apparently a SSB type of short: wave radio receiver, the frequency of the received signal would always be below 30 MHz (the short wave band). The teaching of the Yaesu patent would not appear to apply to a wide-band receiver. Moreover, were an attempt made to apply this teaching to a wide-band receiver, for higher frequencies, a very high LO frequency would be required. Such a high LO frequency leads to instabilities of operation.

Additional s;canner-type radio receivers are known from many United States patents, including:

U.S. Pat. No. 3,937,972, issued to E. C. Snell;
U.S. Pat. No. 3,961,261, issued to P. W. Pflasterer;
U.S. Pat. No. 3,987,400, issued to G. H. Fathauer;
U.S. Pat. No. 4,000,468, issued to J. R. Brown;
U.S. Pat. No. 4,027,251, issued to G. H. Fathauer;
U.S. Pat. No. 4,114,103, issued to P. W. Pflasterer;
U.S. Pat. No. 4,123,715, issued to G. H. Fathauer;
U.S. Pat. No. 4,270,217, issued to W. Baker; and
U.S. Pat. No. 4,409,688, issued to W. Baker These patents are believed to be directed to scanner type radio receivers, and to address merely the control of the scanning operation of such a radio receiver. They do not appear to address the problem of internally-generated interferences, or of resulting frequencies or frequency bands which cannot be received by a radio receiver.

SUMMARY OF THE INVENTION

In view of the above, a primary object for this invention is to provide a radio receiver which avoids one or more of the shortcomings of the conventional technology.

It would be an advantage if a radio receiver were able to provide full-spectrum reception, preferably in a band extending from about 10 kHz to about 2600 MHz. Accordingly, an object for this invention is to provide such a radio receiver.

Another advantage for such a radio receiver would be realized if spurs, inter-modulation products, and images were avoided across the entire frequency band of reception for such a radio receiver. Thus, another object for this invention is to provide such a radio receiver which avoids spurs, inter-modulation products, and images across a frequency band extending from about 10 kHz to about 2600 MHz.

In view of the above, and according to one preferred embodiment of the present invention, the invention provides a radio receiver for receiving a radio signal of frequency FR, the radio receiver including successive first and second intermediate-frequency demodulation sections, each demodulation section including a respective local oscillator and a respective mixer, the mixer of the first demodulation section receiving the radio signal, and the local oscillator of the first demodulation section also providing a frequency signal FL1 to the mixer to provide an intermediate-frequency signal IF1 passing to the mixer of the second demodulation section, the local oscillator of the second demodulation section also providing frequency signal FL2 to the mixer to provide intermediate-frequency signal IF2, the radio receiver comprising: the first demodulation section having an intermediate frequency filter/amplifier with a band-pass of definite width and receiving signal IF1, means for varying the frequency FL1 so that signal IF1 falls always within the definite band-pass, and means for responsively varying signal FL2 so that signal IF2 remains constant.

According to another aspect, the present invention provides a super-hetrodyne radio receiver for receiving and demodulating a radio signal of frequency FR to provide an output, the radio receiver comprising: a first demodulation section having a respective first local oscillator providing a demodulation frequency signal FL1 within a certain frequency band, a respective first mixer receiving both the radio signal and the demodulation frequency signal FL1 to provide a first intermediate-frequency signal. IF1, and an intermediate-frequency filter/amplifier with a band-pass of definite width, means for varying the first demodulation frequency signal FL1 within the certain frequency band to provide the intermediate-frequency signal IF1 within the band-pass of the intermediate-frequency filter/amplifier.

Still further, a method of operating a super-hetrodyne radio receiver for receiving a radio signal of frequency FR is provided by the present invention, including steps of, operating successive first and second intermediate-frequency demodulation sections of the radio receiver by providing each demodulation section with a respective local oscillator and a respective mixer; providing the mixer of the first demodulation section with both a received radio signal and a frequency signal FL1 from the local oscillator of the first demodulation section to provide an intermediate-frequency signal IF1; passing the intermediate-frequency signal IF1 to the mixer of the second demodulation section and providing a second frequency signal FL2 from the second local oscillator to provide intermediate-frequency signal IF2; providing the first demodulation section with an intermediate frequency filter/amplifier having a band-pass of definite width and receiving signal IF1, and providing means for varying the frequency FL1 so that signal IF1 falls always within the definite band-pass; and providing means for responsively varying signal FL2 so that signal IF2 remains constant.

An advantage of the present invention resided in its apparently anticipatory response to the possibility of spurs, inter-modulation products, or images occurring during the operation of the receiver, and the anticipatory shifting of the first and second LO frequencies (FL1 and FL2) in order to prevent these interferences to radio reception from occurring perceptibly to the operator. In other words, the receiver is neither limited in its ability to receive a signal in particular frequency bands as are conventional receivers, nor does is it require either corrective action on the part of a user or on the part of an internal corrector device to remove interference after it has occurred. Instead, the present invention includes a monitoring function which compares the operating frequency of the radio (i.e., the frequency of the received signal) to a list of those frequencies at which interferences are known to occur. When a frequency of interference is arrived at, the first and second LO frequencies are shifted to shift the first IF frequency.

Further to the above, this frequency shift for the first and second LO may be either between two possible frequencies in their respective bands, or to a selected frequency (possibly a frequency unique to a particular receiving frequency, FR) within the operating band of each LO, but always results in the first and second IF frequencies (IF1 and IF2) being within a band-pass of the associated amplifier. Thus, the possible cross-spurious or other interference is avoided. The necessary shift in internal LO frequencies is effected so quickly in response to operation at a received frequency at which an interference occurs, that the operator of the radio receiver will not perceive the shift. The operator of the radio will only perceive an apparently seamless reception of radio signals within the wide band of the receiver (i.e., a full spectrum of reception) with no spurs, inter-modulation products, or images. Moreover, internally-generated interference is eliminated before it occurs within the perception of an operator of the radio receiver, according to the present invention.

A better understanding of the present invention will be obtained from reading the following description of a single preferred exemplary embodiment of the present invention when taken in conjunction with the appended drawing Figures, in which the same features (or features analogous in structure or function) are indicated with the same reference numeral throughout the several views. It will be understood that the appended drawing Figures and description here following relate only to one or more exemplary preferred embodiments of the invention, and as such, are not to be taken as implying a limitation on the invention. No such limitation on the invention is implied, and none is to be inferred.

DETAILED DESCRIPTION OF AN EXEMPLARY PREFERRED EMBODIMENT OF THE INVENTION

Figure 1:
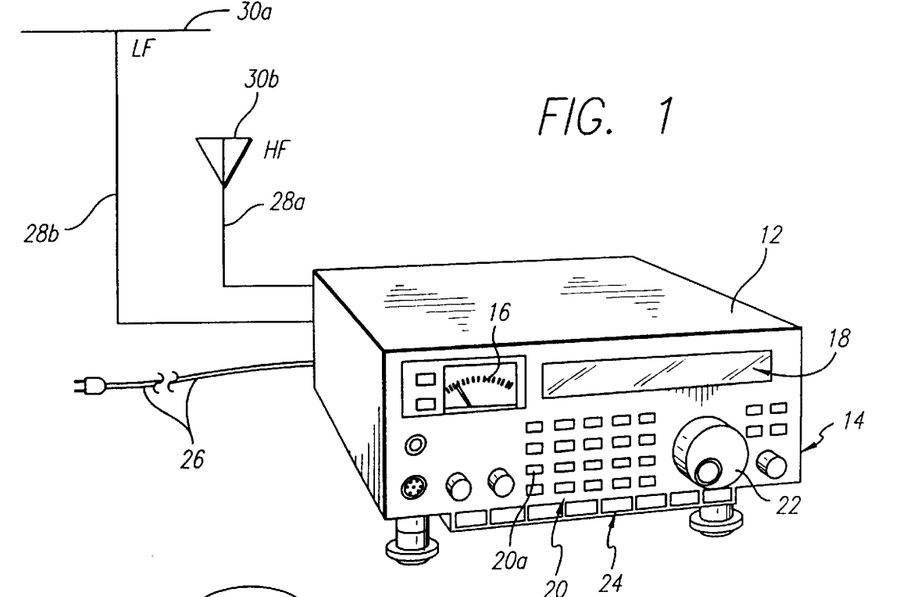
FIG. 1 is an external perspective view of a scanner type of radio receiver embodying the present invention, with antennae and power supply cord for the radio receiver shown schematically.

Viewing FIG. 1, a radio receiver 10 according to the present invention is embodied as a scanner type of radio receiver. In other words, the scanner type of radio receiver uses a pre-selected list of frequencies, or a signal seeking function, for example, to automatically scan the radio frequency spectrum looking for radio signals to be received. When such a signal is located, the receiver will temporarily stop its scanning operation to receive the signal. When the signal concludes, the radio returns to its automatic scanning operation.

However, it will be understood that the following description of the particularly preferred scanner embodiment of the invention is in no way limiting on the invention. In fact, the present radio receiver apparatus and method invention can be implemented in a wide variety of different radio receiver embodiments other than in a scanner type of radio receiver. For example, a radio receiver which does not self-scan, but which requires its user to tune to particular frequencies of reception may implement the present invention. Importantly, the present invention may also be implemented in the receiver portion of a transceiver type of radio, which allows not only for reception but also for transmission of radio signals. As is understood, in such a case the receiver portion of the transceiver would not ordinarily scan the radio frequency spectrum, but would be tuned to the same frequency on which transmissions are made so that two-way alternating transmissions and receptions can be effected.

Further considering FIG. 1, it is seen that the exemplary scanner type of radio receiver 10 includes a cabinet 12 having a front control panel 14. The control panel 14 is provided with visible output devices including a signal strength meter 16 and a liquid crystal display (LCD) 18. As indicated in FIG. 1, the LCD display is subdivided into portions which preferably provide the user of the radio receiver 10 with information about the received frequency (indicated with numeral 18a), mode of reception (indicated with numeral 18b—in this instance FM reception), preselected channel number (indicated with arrowed numeral 18c—indicating channel number 15), as well as status information concerning other features of the radio receiver 10.

Also on the front panel 14 is provided an array of operator input controls 20, including push buttons 20a particularly for control of the radio by use of an internal microprocessor (as will be explained) and a rotatable manual tuning dial 22. Below the front panel controls 20 and 22, the cabinet 12 defined a slot 24 by which sound from an internal speaker (identified below) is communicated outwardly and forwardly of the cabinet 12 to a user (not seen in the drawing Figures) of the radio 10.

Radio 10 also includes a rear panel (not illustrated) at which various additional connections may be provided. For example, connections may be provided at this rear panel for a power cord 26, and for antenna leads 28a and 28b, each connecting individually with respective low-frequency and high-frequency antennas 30a and 30b. At this rear panel, connections may also be provided for supply of power from the radio 10 to accessory devices, and for such optional functions as an external speaker, a remote mute control, and for a remote control device (i.e., an infrared controller similar to a television remote) for generally controlling the operating functions of the radio 10 at a distance. None of these connections are illustrated in the drawing Figures as they are all quite ordinary.

Figure 2A:
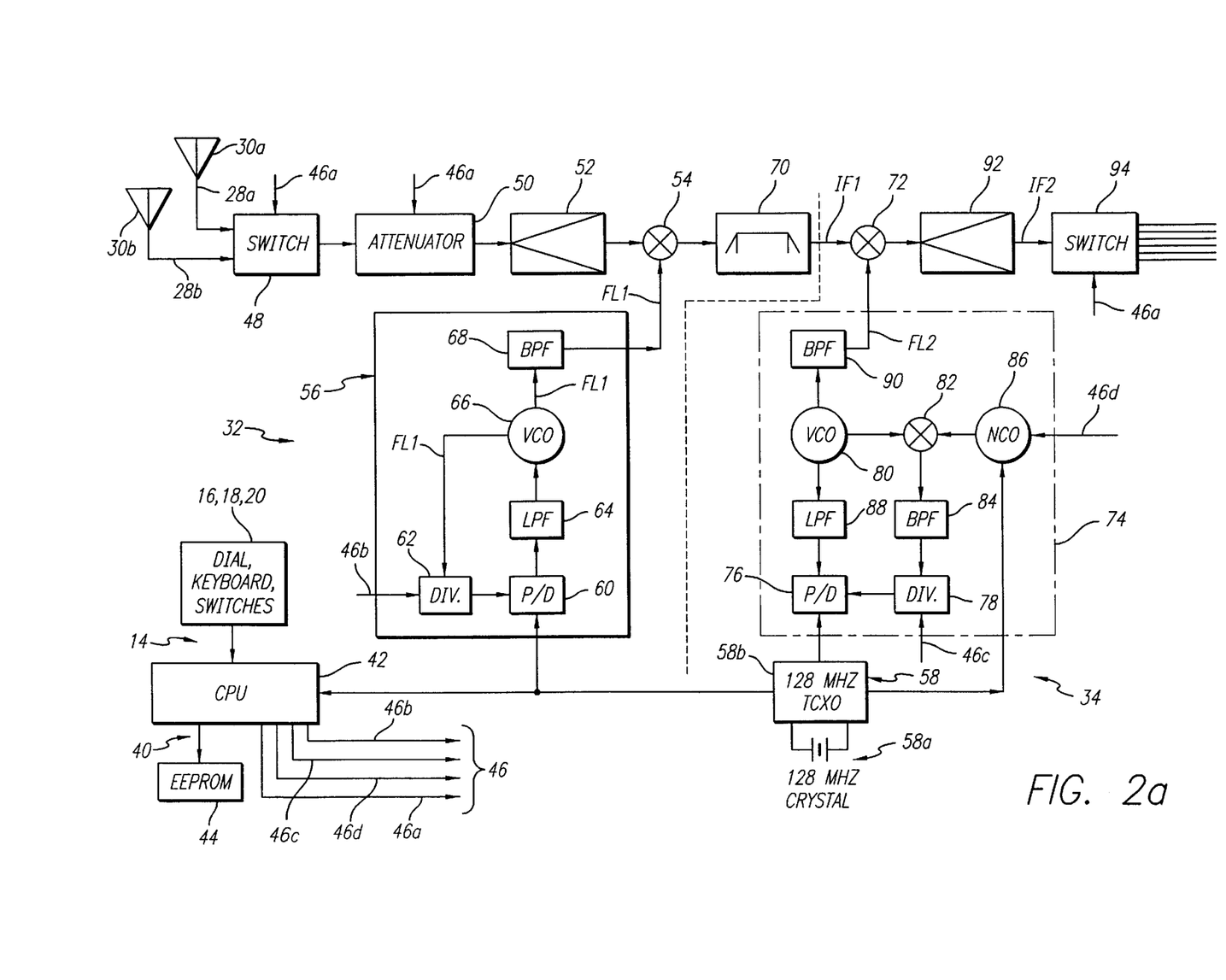
FIGS. 2a and 2b together provide a schematic illustration of the circuit architecture of an exemplary embodiment of a radio receiver according to the present invention. This radio receiver may take the form of the scanner type of radio illustrated in FIG. 1.
Figure 2B:
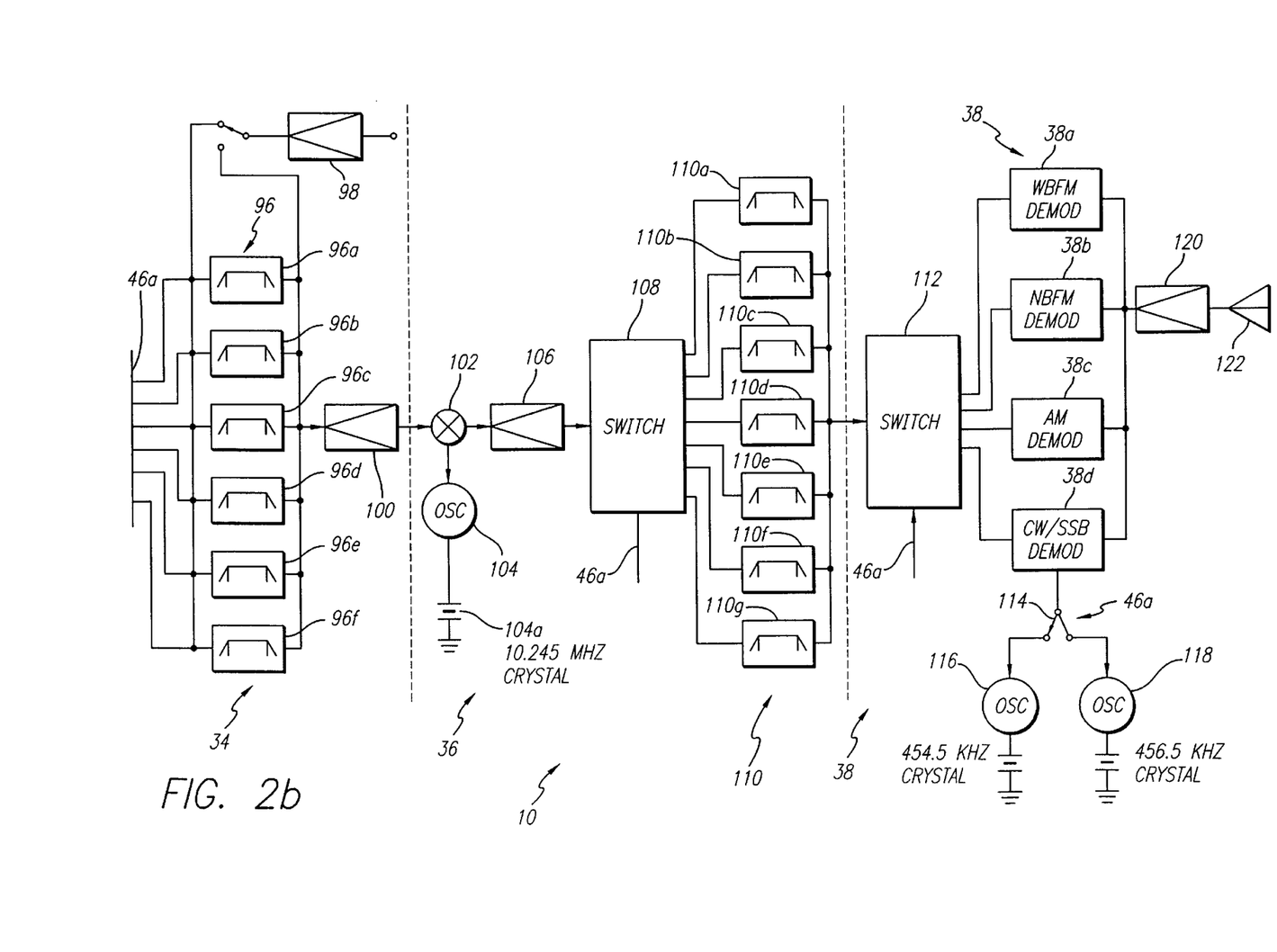

Considering now FIGS. 2a and 2b in conjunction with one another (it will be noted that FIGS. 2a and 2b may be laid adjacent: to one another to provide a full circuit schematic) it is seen that the radio receiver 10 is configured as a triple super-hetrodyne type of receiver, having a first, second and third intermediate frequency (IF) sections (generally indicated with numerals 32, 34, and 36) leading to a carrier frequency demodulation (or output) section 38. For the convenience of the reader in more easily visualizing the sections 32, 34, and 36, dashed demarkation lines are provided in FIG. 2. These dashed lines are not be misconstrued as showing or suggesting a physical separation in the radio 10, but are provided only as a convenience and for purposes of organizing the presentation of the preferred embodiment set forth in the specification.

Importantly, the radio receiver 10 according to the depicted embodiment includes a central processor unit (CPU) control section 40. As mentioned above, the preferred embodiment of the invention is configured as a scanner type of radio receiver, so the CPU section 40 is used also in effecting these scanning functions, and also in performing user-programmable functions such as selecting certain frequencies and modes of operation to be scanned consecutively. However, it will be recognized that a radio according to the present invention need not be configured as a scanner type of radio, and need not include a microprocessor control section in order to control its operation. The many functions which are conveniently and rapidly performed by the microprocessor control section 40 can alternatively be performed by a user of a radio within the scope of the present invention. In other words, the microprocessor control section 40 is an important aspect of the preferred embodiment of the invention because it adds much to the convenience and pleasure of use of the scanner-type radio 10 while automating many functions. However, the invention is not limited to use of a microprocessor control section for the performance of these functions, especially with respect to the method of operation of the radio receiver 10, as will be more clearly understood after a complete study of this specification.

Continuing with consideration of FIGS. 2a and 2b, it is seen that the control section 40 includes a microprocessor 42 (with internal or external ROM and RAM memory—which is not shown separately in the drawing Figures), and associated input and output devices, such as those discussed above and indicated with numerals 16, 18, and 20 on the front panel 14. Associated with the microprocessor 42 is an electronically-erasable programmable read-only memory (EEPROM) 44, which is used to store instructions and data used in the operation of the radio 10 (such as a look-up table or data structure—as will be further described below). Microprocessor 42 provides plural command outputs, generally indicated at 46, to various devices of the radio 10 as also will be explained. One of these command outputs (indicated at 46a), provides output signals to the display devices at front panel 14, provides command inputs to various devices of the radio receiver 10 (as will be seen), and also provides a switching input command to a multi-position antenna switch 48.

While the antenna switch 48 is depicted and described as being of two-position type, such is not a limitation on the invention. In fact, the switch 48 can be configured as a multi-position type, with the switch position controlled as described in order to allow radio 10 to function with an array of antennas. Dependent upon the commanded position of switch 48, one of the two antennas 30a or 30b will be connected to the first IF section 32. In the present instance, antenna 30a is preferably configured for receiving radio signals in the short wave band (i.e., below 30 MHz), while antenna 30b is configured for receiving radio signals at frequencies above 30 MHz. In combination, the two antennas provide the radio 10 with the ability to receive radio signals in the band from at least as low as 10 KHz and at least as high as 2600 MHz.

The first IF section 32 includes also a microprocessor-switchable attenuator 50 (note command input 46a). This attenuator 50 can be automatically switched in or out (that is, to attenuate or pass a signal without attenuation). When switched in the attenuator 50 attenuates strong radio signals to prevent overload of the receiver 10. A first radio-frequency (RF) amplifier 52 receives the radio frequency signal from attenuator 48 and provides an amplified signal to a first IF mixer 54. This first IF mixer 54 receives the amplified RF signal from amplifier 52, along with a first local oscillator frequency signal from first local oscillator (FLO) section 56.

Preferably, the first mixer 54 is the double-balanced type using diodes. Also preferably, the FLO section 56 generates a frequency above the received radio frequency, and forms an "upper conversion" type of system for receiving radio frequencies below about 1400 MHz. This upper conversion type of system is necessary to avoid creation of an image frequency interference. On the other hand, for receiving frequencies above about 1400 MHz, the FLO section 56 generates a frequency below the received radio frequency, and provides a "lower conversion" type of super-hetrodyne demodulation system. Further to the above, the FLO section 56 preferably provides a frequency signal selected in view of the received frequency (FR) so that the frequency from the first IF section 32 (referred to as IF1) being provided to the second IF section 34 is between the frequencies of 622.0 MHz and 622.4 MHz. As a result, the first IF section 32 provides a signal (IF1) which preferably shifts between 622.0 MHz and 622.4 MHz (or within the frequency band), and always within a frequency band-pass of an associated filter/amplifier (to be further described below).

Considering the first LO 56 in general, it is seen that this LO includes a temperature-compensated crystal oscillator (TCXO) 58 providing a master frequency signal used in the LO 56, and which is also used elsewhere in the radio receiver 10, as will be described. The TCXO 58 includes a crystal 58a, and a temperature compensated oscillator circuit 58b. Preferably, the master frequency signal from TCXO 58 is at a frequency of 12.8 MHz. This frequency signal from TCXO 58 is provided to a phase comparator 60 of the LO 56 for a purpose to be described below. In overview, it is seen that the LO 56 is of frequency synthesizer phase-locked-loop (PLL) configuration. This first LO 56 includes a programmable divider 62 receiving a numerical control command 46b (of value $N_1$) from microprocessor 42, a frequency signal from an oscillator to be described (referred to as FL1), and effecting a division of this FL1 frequency signal by $N_1$ (i.e., multiplication of FL1 by $1/N_1$). The resulting signal, which is equal to $FL1/N_1$, is provided to phase comparator 60, which also effects a division by a value referred to as $M_1$.

From the comparator 60, a control signal passes via a low pass filter (LPF) 64 to a voltage controlled oscillator (VCO) 66. This VCO 66 responsively provides the frequency signal FL1. The frequency signal from VCO 66 is fed back to programmable divider 62 to serve as the frequency signal upon which the $1/N_1$ division is effected. As a result of the above, the frequency of oscillator 66 (that is, FL1) can be expressed as:

$$FL1=f\{N_1 \times M_1 \times \text{Master Frequency}\} \qquad \text{(equation 1)}$$

It will be noted that the value $N_1$ is controlled and variable by microprocessor 42. Accordingly, the frequency of signal FL1 is also a variable controlled by the microprocessor 42. Signal FL1 is passed via a band-pass filter (BPF) 68 to mixer 54. As noted above frequency signal FL1 is selected in view of FR so that one of the frequency results (i.e., one of the frequency sum-and-difference results) of the upper conversion or lower conversion result of the frequency mixing at mixer 54 is a frequency of 622.0 MHz or 622.4 MHz (or is within this frequency band). As described above, mixer 54 effects an upper or lower conversion of the received radio frequency signal dependent upon the frequencies FR and FL1. The resulting converted frequency signals are provided to a first IF filter/amplifier 70 (i.e., first IFF/A) having a selected band-pass characteristic. The band-pass characteristic of this filter amplifier 70 is selected to be just wide enough to accommodate the range of frequencies from 622.0 MHz to 622.4 MHz to select the frequency result to become IF1.

Stated differently, FL1 is provided within a frequency band which falls within the band-pass of first IFF/A 70. As a result, the amplifier 70 can maintain its gain and output, so that a desirable performance level is achieved by radio receiver 10. An appropriately amplified signal (IF1 amplified) is provided by first IFF/A 70 to the second IF section 34.

Second IF section 34 includes a second IF mixer 72. This second IF mixer 72 receives the selectively up-converted or down-converted RF signal from first IF section 32 (i.e., either an upper or a lower sum-and-difference frequency conversion result from the radio signal at the received frequency). As noted above, this signal has been referred to as IF1 amplified. The second IF mixer 72 is preferably also of the double-balanced type using diodes, and may be the same as mixer 54. Mixer 72 also receives a second local oscillator signal (referred to as FL2) from a second local oscillator section 74. Preferably, the second LO section 74 generates a frequency below the received radio frequency, and forms a "lower conversion" type of hetrodyne system.

In this case also, the second LO 74 preferably shifts between or provides a signal at or between the frequencies of 610.9 MHz and 611.7 MHz. As a result, as will be seen, the mixer 72 for this second IF section 34 produces an output signal consistently at a frequency of 10.7 MHz.

It is seen that the second LO 74 is similar to a phase-locked-loop configuration, but includes provision for an additive correction frequency. The LO 74 also receives the master frequency signal from TCXO 58. This master frequency signal is received by a phase comparator 76. A programmable divider 78 receives a second numerical control command 46c (of value $N_2$) from microprocessor 42, and a frequency signal referred to as FL2 (+Fn) from an oscillator 80 via a mixer 82 and band-pass filter 84. $N_2$ is under the control of microprocessor 42. The frequency value of Fn represents the frequency of a signal provided by a numerically controlled oscillator (NCO) 86. NCO 86 is also known as a direct digital synthesizer, and is used to generate a specific range of frequencies in specific frequency increments. That is, the increments between adjacent frequencies generated by oscillator 86 in response to successively-valued digital command words can be as little as 1 Hz. The frequency increments for the frequency signal provided by NCO 86 may be larger if desired.

Oscillator 86 receives a numerical command value 46d from microprocessor 42. The value of command 46d is a digital word value variable by microprocessor 42, so the frequency Fn is under control of this microprocessor. Phase comparator 76 effects a division of this frequency signal by $N_2$ (i.e., multiplication of FL2 (+Fn) by $1/N_2$). The resulting signal, which is equal to $FL2(+Fn)/N_2$, is provided to phase comparator 76. As a result, a further division by a value referred to as $M_2$ is effected.

From the phase comparator 76, a control signal passes via a low pass filter (LPF) 88 to a voltage controlled oscillator (VCO) 80. This VCO 80 provides the frequency signal FL2, which will be understood by now from an inspection of FIG. 2. Considering the above and FIG. 2, it is seen that the frequency of oscillator 80 (that is, the frequency of signal FL2) can be expressed as:

$$FL2=f\{(N_2 \times M_2 \times \text{master frequency})-Fn\} \qquad \text{(equation 2)}$$

Frequency signal FL2 is passed via a band-pass filter (BPF) 90 to mixer 72. As noted above FL2 is preferably at or between the frequencies of 610.9 MHz and 611.7 MHz. An output of mixer 72 (i.e., the output of the second IF section 34—referred to as signal IF2) is consequently at a frequency of 10.7 MHz. This IF2 signal at a constant frequency of 10.7 MHz is provided to a second IF amplifier 92 and (after amplification) to a multi-position microprocessor-controlled switch 94 (see input 46a to switch 94).

It will be recognized that the switch 94 could be manually controlled if desired, but also that in a scanner type of radio receiver a desire for rapid scanning mitigates in favor of automation of controls. Because the second IF amplifier 92 is required to amplify only a single frequency (i.e., 10.7 MHz in this case), the band-pass for this amplifier is much narrower than for filter/amplifier 70. Switch 94 controls which one of plural post-filters 96 (individually referred to with numerals 96a through 96f) is switched into operation in the radio receiver 10. Accordingly, a first level of selectivity adjustment and noise signal rejection is provided for the radio receiver 10.

A manually-switched buffer amplifier 98 is also provided for external output of the signal from amplifier 92 to external adapter devices, such as to a panoramic band scope adapter, or a digital demodulator for satellite communications, or a video converter output device providing TV reception, or for other types of signal processing or demodulation devices.

From the selected post-filter 96a–f, the 10.7 MHz signal is provided to third IF stage 36 via buffer amplifier 100. A mixer 102 of section 36 receives this signal along with a signal of 10.245 MHz from a third local oscillator (LO) 104 receiving a master signal of 10.245 MHz from a crystal 104a. This mixer 102 effects a lower conversion of the received signal to provide a signal at 455 KHz; (i.e., 10.7 MHz–10.245 MHz=0.455 MHz=455 KHz). The resulting signal of 455 KHz is amplified by an amplifier 106, and is provided by a second microprocessor-controlled switch 108 to a selected one of IF filters 110 (individually referenced with numerals 110a through 110g). Again, the filters 110 provide a second level of selectivity and noise-signal rejection tuning for the radio receiver 10. A subsequent microprocessor-controlled switch 112 directs the filtered 455 KHz signal at this point to a selected part of the carrier frequency demodulation section 38.

As is seen on FIG. 2b, this output section 38 of the radio receiver 10 includes a demodulation sub-section 38a for WBFM, a sub-section 38b for NBFM, sub-section 38c for AM, and sub-section 38d for CW/SSB. The demodulator section 38d includes a detector (not shown separately in the drawing Figures) indicating when SSB (as opposed to CW) transmissions are received. In the case of SSB transmissions, the detector indicates whether they are upper or lower side band, and provides an output to microprocessor 42. In order to effect the SSB demodulations, a microprocessor-controlled switch 114 provides a selected one of signals from oscillators 116 and 118 (the former operating at 454.5 KHz and the latter at 456.5 KHz—to provide a selected one of upper or lower side band demodulation in conjunction with the 455 KHz signal from IF section 36).

Those ordinarily skilled in the pertinent arts will recognize that these demodulation sub-sections are exemplary only, and that other or different output section devices can be used. An audio amplifier 118 receives the demodulated signal from a section 38a–38d, and powers a speaker 122. As described above, the speaker 122 provides an audio output to a user of the radio receiver 10 via slot 24 in cabinet 12.

Having observed the structure and part of the operation of radio receiver 10, further attention may now be given to particulars of its operation. It will be understood that frequency numbers set forth in this specification are for purposes of illustration and description only, and do not represent a limitation on the invention. A radio receiver within the scope of the present invention may use the frequency numbers set forth herein. However, a radio receiver within the scope of this invention may use partially or entirely different frequency numbers.

As an example, and considering the radio receiver 10 described above, it is seen that if the received frequency (FR) is 144.900 MHz, then the related frequencies can be as follows:

EXAMPLE 1

FR=144.900 MHz
FL1=767.3 MHz (microprocessor controlled)
IF1=622.4 MHz
FL2=611.7 MHz (microprocessor controlled)
Fn=5.9 MHz
IF2=10.7 MHz In view of the above, it is seen that a difference between a fourth overtone frequency of FL1 and a fourth overtone frequency of FL2 is equal to IF1. That is:

$FL1 \times 4 = 767.3$ MHz$\times 4 = 3069.2$ MHz $FL2 \times 4 = 611.7$ MHz$\times 4 = 2446.8$ MHz $3069.2$ MHz$- 2446.8$ MHz$= 622.4$ MHz$= IF1$ Accordingly, the microprocessor 42 is used (as explained below) to monitor FR and to detect from a look-up table or data structure stored at EEPROM 44 when a received frequency results in an internally generated interference like the one set out above. When such an interference is present, the FL1 frequency is changed so that IF1 changes within the band-pass of IFF/A 70 and the interference is avoided. Stated differently, in this case FL1 is shifted 400 KHz lower and Fn is shifted 400 KHz higher to maintain IF2 at 10.7 MHz. The resulting frequencies are:

FR=144.900 MHz
FL1=766.9 MHz (microprocessor controlled)
IF1=622.0 MHz
FL2=611.3 MHz (microprocessor controlled)
Fn=6.3 MHz
IF2=10.7 MHz Thus:

$FL1 \times 4 = 766.9$ MHz$\times 4 = 3067.6$ MHz $FL2 \times 4 = 611.3$ MHz$\times 4 = 2445.2$ MHz $3067.6$ MHz$- 2445.2$ MHz$= 622.4$ MHz (not equal to $IF1$)

If follows that the cross spurious interference is avoided. But, because the shift of IF1 is performed within a band-pass of IFF/A 70, the performance of the radio 10 is maintained (i.e., signal amplification at first IF stage 32 is not compromised by operation at a frequency outside of the band-pass and best amplification performance of IFF/A 70). If will easily be understood that the necessary numerical value for signal 46b is stored in the look-up table or data structure of EEPROM 44 as an entry corresponding to a particular FR. The above example is only a typical case, and it will be seen that the radio receiver is provided with a look-up table or data structure which enables detection and response to (avoidance of) a great number of other internal interferences.

Considering another example, it is seen that if FR is equal to a harmonic of FL2, an interference will result. That is if:

EXAMPLE 2

FR=617.6 MHz
FL1=1240.0 MHz (microprocessor controlled)
IF1=622.4 MHz
FL2=611.7 MHz (microprocessor controlled)
Fn=5.9 MHz
IF2=10.7 MHz Thus:

$FL2 + Fn = 617.6$ MHz$= FR$

In view of the above, it is seen that an internal interference would result. Consequently, Fn is shifted lower by 400 KHz while FL2 is held constant by a modification of the command signal 46c provided to programmable divider 78. The result is:

FR=617.6 MHz
FL1=1240.0 MHz (microprocessor controlled)
IF1=622.4 MHz
FL2=611.7 MHz (microprocessor controlled)

Fn=6.3 MHz

IF2=10.7 MHz

Thus:

$FL2+Fn$=618.0 MHz (not equal to $FR$)

Figure 3:
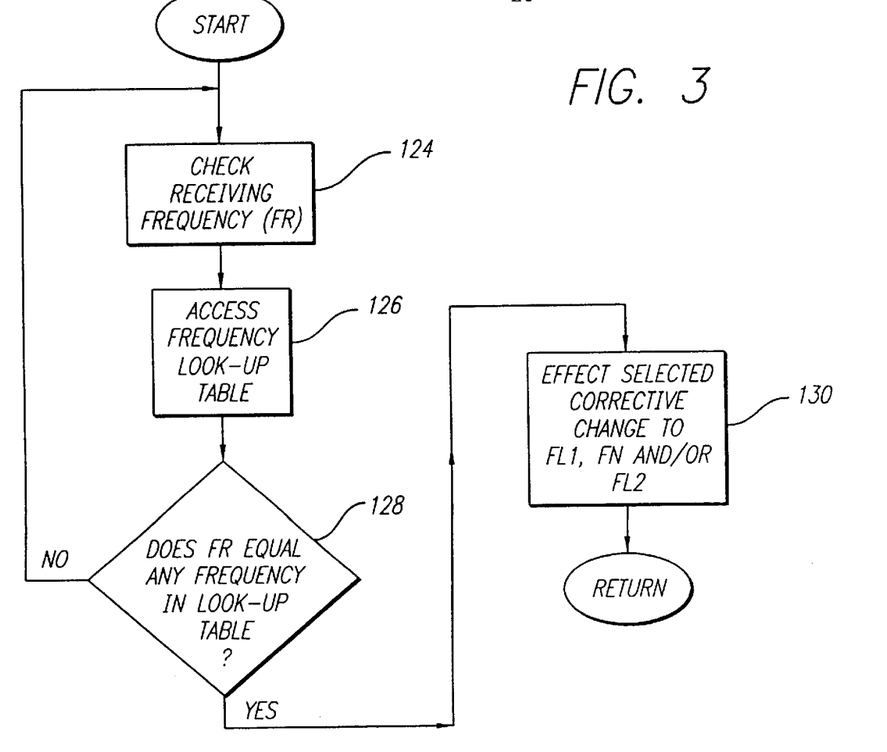
FIG. 3 is a representative flow diagram for routines used by a microprocessor of the present radio receiver to check for internal interferences, and to take corrective actions preventing the perceivable occurrence of these interferences.

Considering now FIG. 3, a flow chart is shown of a sub-routine continuously executed (i.e., between interrupts to allow other functions to be completed) by microprocessor 42. As is seen in FIG. 3 at 124, microprocessor 42 checks the value of the received frequency FR, accesses the look-up table, and compares this FR value (indicated at 126 and 128 on FIG. 3) against values contained in a look-up table or data structure. This check, access, and compare operation can be visualized as the microprocessor 42 moving a virtual pointer along a frequency scale in correlation to the value of FR. Adjacent to this frequency scale may be visualized a table of corresponding frequency bands at which interferences may occur. A tabulation form of the frequency bands for this data structure is provided in part below:

frequencies of FR at which an internal interference may be experienced within a radio receiver within the scope of the present invention. However, as the virtual pointer moves along the frequency scale and aligns with one of the indicated frequency bands at which an interference may result (indicated by a "yes" response to the branch operation 128 of FIG. 3) there is indicated at corresponding locations of the table (not shown) the corrective values for command signal (s) 46b, 46c, and/or 46d. The providing of the necessary corrected command signals to the programmable divider 46, to programmable divider 70, and/or to numerically controlled oscillator 86 (as was explained in the above examples) is indicated at 130 on FIG. 3.

Reconsidering the above examples, it is seen that the illustrative frequencies are ones at which the answer to the branching question at flow chart step 128 would be "yes". Accordingly, the examples provided give two illustrative cases of the corrective actions which are implemented by the microprocessor 42 in response to instructions saved in corresponding memory locations of the EEPROM 44. These

TABLE (Frequencies in MHz)

| | Low | | High | | Low | | High | | Low | | High |
|---|---|---|---|---|---|---|---|---|---|---|---|
| 1 | 5.80 | – | 6.00 | 43 | 911.83 | – | 911.98 | 85 | 1,814.42 | – | 1,821.44 |
| 2 | 93.01 | – | 93.05 | 44 | 912.07 | – | 912.22 | 86 | 1,821.66 | – | 1,822.19 |
| 3 | 113.75 | – | 113.79 | 45 | 950.20 | – | 950.40 | 87 | 1,827.59 | – | 1,828.17 |
| 4 | 139.53 | – | 139.56 | 46 | 962.19 | – | 962.42 | 88 | 1,834.00 | – | 1,834.40 |
| 5 | 144.88 | – | 144.92 | 47 | 966.97 | – | 967.01 | 89 | 1,834.54 | – | 1,834.60 |
| 6 | 188.61 | – | 189.64 | 48 | 967.08 | – | 967.11 | 90 | 1,839.45 | – | 1,839.78 |
| 7 | 196.74 | – | 196.77 | 49 | 983.77 | – | 983.80 | 91 | 1,840.19 | – | 1,840.70 |
| 8 | 224.00 | – | 224.04 | 50 | 983.87 | – | 983.90 | 92 | 1,848.20 | – | 1,848.59 |
| 9 | 289.72 | – | 289.82 | 51 | 1,000.53 | – | 1,000.59 | 93 | 1,850.02 | – | 1,850.40 |
| 10 | 393.47 | – | 393.50 | 52 | 1,001.30 | – | 1,001.40 | 94 | 1,852.30 | – | 1,853.00 |
| 11 | 400.54 | – | 400.66 | 53 | 1,001.48 | – | 1,001.52 | 95 | 1,855.42 | – | 1,855.78 |
| 12 | 480.48 | – | 480.57 | 54 | 1,001.60 | – | 1,001.70 | 96 | 1,856.54 | – | 1,856.57 |
| 13 | 480.61 | – | 480.64 | 55 | 1,015.84 | – | 1,015.87 | 97 | 1,858.94 | – | 1,859.07 |
| 14 | 497.25 | – | 497.45 | 56 | 1,017.10 | – | 1,017.38 | 98 | 1,861.93 | – | 1,862.00 |
| 15 | 514.09 | – | 514.22 | 57 | 1,033.90 | – | 1,034.20 | 99 | 1,969.28 | – | 1,969.30 |
| 16 | 525.99 | – | 526.21 | 58 | 1,050.70 | – | 1,050.98 | 100 | 2,052.00 | – | 2,053.00 |
| 17 | 530.73 | – | 530.95 | 59 | 1,201.40 | – | 1,201.50 | 101 | 2,445.03 | – | 2,145.35 |
| 18 | 547.55 | – | 547.69 | 60 | 1,201.70 | – | 1,201.80 | 102 | 2,145.55 | – | 2,146.00 |
| 19 | 581.14 | – | 581.28 | 61 | 1,201.99 | – | 1,202.02 | 103 | 2,148.16 | – | 2,148.19 |
| 20 | 590.13 | – | 590.27 | 62 | 1,206.65 | – | 1,207.27 | 104 | 2,152.64 | – | 2,152.67 |
| 21 | 595.50 | – | 595.70 | 63 | 1,216.30 | – | 1,216.64 | 105 | 2,153.02 | – | 2,153.05 |
| 22 | 597.93 | – | 597.96 | 64 | 1,217.25 | – | 1,217.56 | 106 | 2,156.18 | – | 2,153.19 |
| 23 | 598.03 | – | 598.05 | 65 | 1,217.74 | – | 1,217.77 | 107 | 2,153.30 | – | 2,153.62 |
| 24 | 602.96 | – | 602.99 | 66 | 1,218.00 | – | 1,218.10 | 108 | 2,155.57 | – | 2,156.20 |
| 25 | 603.06 | – | 603.09 | 67 | 1,222.72 | – | 1,222.75 | 109 | 2,158.82 | – | 2,159.13 |
| 26 | 604.35 | – | 604.50 | 68 | 1,222.99 | – | 1,223.02 | 110 | 2,165.30 | – | 2,165.40 |
| 27 | 605.50 | – | 605.70 | 69 | 1,223.25 | – | 1,223.28 | 111 | 2,244.99 | – | 2,245.57 |
| 28 | 605.79 | – | 605.82 | 70 | 1,229.04 | – | 1,229.27 | 112 | 2,259.40 | – | 2,260.00 |
| 29 | 606.10 | – | 606.30 | 71 | 1,234.80 | – | 1,235.40 | 113 | 2,426.40 | – | 2,428.00 |
| 30 | 611.53 | – | 611.67 | 72 | 1,433.49 | – | 1,433.52 | 114 | 2,439.25 | – | 2,440.80 |
| 31 | 611.70 | – | 612.30 | 73 | 1,433.67 | – | 1,433.69 | 115 | 2,445.20 | – | 2,445.76 |
| 32 | 614.70 | – | 614.90 | 74 | 1,440.47 | – | 1,440.77 | 116 | 2,446.25 | – | 2,446.80 |
| 33 | 617.30 | – | 617.80 | 75 | 1,480.00 | – | 1,480.40 | 117 | 2,450.80 | – | 2,450.90 |
| 34 | 715.35 | – | 715.38 | 76 | 1,533.59 | – | 1,534.00 | 118 | 2,451.40 | – | 2,451.50 |
| 35 | 715.45 | – | 715.48 | 77 | 1,541.22 | – | 1,542.00 | 119 | 2,451.60 | – | 2,452.40 |
| 36 | 732.14 | – | 732.27 | 78 | 1,544.40 | – | 1,544.60 | 120 | 2,461.40 | – | 2,461.50 |
| 37 | 748.93 | – | 748.96 | 79 | 1,637.47 | – | 1,637.50 | 121 | 2,461.80 | – | 2,462.00 |
| 38 | 749.00 | – | 749.09 | 80 | 1,642.44 | – | 1,642.47 | 122 | 2,462.24 | – | 2,462.27 |
| 39 | 755.68 | – | 755.88 | 81 | 1,642.74 | – | 1,642.77 | 123 | 2,462.70 | – | 2,462.80 |
| 40 | 841.39 | – | 841.42 | 82 | 1,644.39 | – | 1,644.74 | 124 | 2,466.80 | – | 2,467.05 |
| 41 | 849.74 | – | 849.77 | 83 | 1,646.67 | – | 1,648.68 | 125 | 2,467.20 | – | 2,468.80 |
| 42 | 901.31 | – | 901.46 | 84 | 1,720.19 | – | 1,720.22 | 126 | 2,469.90 | – | 2,470.90 |

Viewing this table, it is seen that the frequency bands are numbered sequentially from lowest to highest in this table simply for purposes of illustration and explanation.

Those ordinarily skilled in the pertinent arts will recognize that I-he table above is not exhaustive of all of the corrective action parts of the table are not set forth in detail because of the volume of information contained, and the fact that the corrective actions will vary according to the frequencies selected for the IF sections of a particular radio receiver. However, in view of this disclosure, those ordinarily skilled in the pertinent arts will be able to compile the necessary frequency list and list of corresponding corrective actions for a radio receiver according to the present invention.

If will be appreciated in view of the above, that in some cases FL1 is changed (always within the band-pass of IFF/A 70), with IF2 being also changed to provide IF2 at 10.7 MHz as a constant (according to the present exemplary preferred embodiment). In other cases, Fn is changed at the same time that the value to divider 78 is changed to keep IF2 constant but to eliminate an interference as explained in the second example set out above. Additional combinations of corrective changes are possible to avoid internal interferences. However, when IF1 is changed it is always within the band-pass of IFF/A 70, with appropriate correction of FL2 to provide IF2 at 10.7 MHz in the present exemplary preferred embodiment. Again, it must be noted that other embodiments of the present invention may use a different frequencies for any one or all of FL1, IF1, FL2, and IF2.

While the present invention has been depicted, described, and is defined by reference to more than one particularly preferred embodiments of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

I claim:

1. A wide-band, full-spectrum scanner radio receiver for receiving a radio signal of frequency FR in a continuous reception band extending from about 10 KHz to about 2600 MHz while avoiding the occurrence of internally-generated interference, said radio receiver comprising:

a first intermediate-frequency demodulation section having a first mixer receiving both the received radio signal of frequency FR and also receiving a variable-frequency demodulation signal FL1 from a first local oscillator to provide a variable-frequency intermediate-frequency signal IF1, said first demodulation section having an intermediate frequency filter/amplifier with a band-pass of definite width and receiving signal IF1, said intermediate frequency filter/amplifier passing an amplified IF1 signal;

a second demodulation section having a respective IF mixer receiving both said amplified IF1 signal and also receiving a second variable-frequency demodulation signal FL2 from a respective second local oscillator to provide a substantially constant intermediate-frequency signal IF2;

control means for changing the frequency of signal FL1 to an alternative frequency FL3 if the frequency FR falls within a predetermined frequency range that is a subset of the continuous reception band so that signal IF1 falls always within said band-pass of said intermediate frequency filter/amplifier, said control means responsively varying the frequency of signal FL2 so that signal IF2 remains of substantially constant frequency and internally-generated interference are avoided, wherein said control means includes a microprocessor and a programmable memory, said programmable memory including entries of frequencies for signal FR within said continuous reception band at which internally-generated interference are experienced with respective frequencies for signals IF1 and IF2, and said microprocessor monitoring said signal FR and responsively providing a command signal to one of said first and second local oscillators to vary the frequency of operation thereof to chance the frequency of one of signals FL1 and FL2 to avoid said internally-generated interference, and means for providing a frequency master signal, and said first local oscillator including a phase-locked-loop circuit receiving said frequency master signal and responsively providing frequency signal FL1, wherein said phase-locked-loop circuit includes a phase comparator receiving said frequency master signal and also receiving a reference signal for phase comparison, said phase comparator responsively providing a control signal, an oscillator receiving said control signal and responsively providing a precursor of said reference signal, a band-pass filter receiving said precursor of said reference signal and passing said signal FL1 to said mixer of said first demodulation section, and a divider means receiving said precursor of said reference signal and dividing said precursor signal by a certain value to provide said reference signal, said microprocessor providing said certain value from said programmable memory as part of said command signal in response to correlation between signal FR and an entry in said programmable memory of a frequency at which an internally-generated interference is experienced to change the frequency of signal FL1 and avoid said interference.

2. The wide-band, full-spectrum scanner radio receiver of claim 1 wherein said certain value is provided by said microprocessor as a digital command input representing a divisor by which said frequency of said precursor signal is to be divided in order to provide said reference signal, and said divider means includes a programmable divider receiving both said precursor of said reference signal and said digital command input.

3. A wide-band, full-spectrum scanner radio receiver for receiving a radio signal of frequency FR in a continuous reception band extending from about 10 KHz to about 2600 MHz while avoiding the occurrence of internally-generated interference, said radio receiver comprising:

a first intermediate-frequency demodulation section having a first mixer receiving both the received radio signal of frequency FR and also receiving a variable-frequency demodulation signal FL1 from a first local oscillator to provide a variable-frequency intermediate-frequency signal IF1, said first demodulation section having an intermediate frequency filter/amplifier with a band-pass of definite width and receiving signal IF1, said intermediate frequency filter/amplifier passing an amplified IF1 signal;

a second demodulation section having a respective IF mixer receiving both said amplified IF1 signal and also receiving a second variable-frequency demodulation signal FL2 from a respective second local oscillator to provide a substantially constant intermediate-frequency signal IF2;

control means for varying the frequency of signal FL1 so that signal IF1 falls always within said band-pass of said intermediate frequency filter/amplifier, said control means responsively varying the frequency of signal FL2 so that signal IF2 remains of substantially constant frequency and internally-generated interference are avoided, wherein said control means includes a microprocessor and a programmable memory, said programmable memory including entries of frequencies for signal FR within said continuous reception band at which internally-generated interference are experienced with respective frequencies for signals IF1 and IF2, and said microprocessor monitoring said signal FR and responsively providing a command signal to one of said first and second local oscillators to vary the frequency of operation thereof to change the frequency of one of signals FL1 and FL2 to avoid said internally-generated interference; and means for providing a frequency master signal, and said first local oscillator including a phase-locked-loop circuit receiving said frequency master signal and responsively providing frequency signal FL1, wherein said phase-locked-loop circuit includes a phase comparator receiving said frequency master signal and also receiving a reference signal for phase comparison, said phase comparator responsively providing a control signal, an oscillator receiving said control signal and responsively providing a precursor of said reference signal, a band-pass filter receiving said precursor of said reference signal and passing said signal FL1 to said mixer of said first demodulation section, and a divider means receiving said precursor of said reference signal and dividing said precursor signal by a certain value to provide said reference signal, said microprocessor providing said certain value from said programmable memory as part of said command signal in response to correlation between signal FR and an entry in said programmable memory of a frequency at which an internally-generated interference is experienced to change the frequency of signal FL1 and avoid said interference.

4. The wide-band, full-spectrum scanner radio receiver of claim 3, wherein said certain value is provided by said microprocessor as a digital command input representing a divisor by which said frequency of said precursor signal is to be divided in order to provide said reference signal, and said divider means includes a programmable divider receiving both said precursor of said reference signal and said digital command input.

* * * * *